United States Patent
Suzumura

(10) Patent No.: US 9,792,989 B2
(45) Date of Patent: Oct. 17, 2017

(54) MEMORY SYSTEM INCLUDING NONVOLATILE MEMORY

(71) Applicant: Toshiba Memory Corporation, Tokyo (JP)

(72) Inventor: Tatsuhiro Suzumura, Yokohama (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 879 days.

(21) Appl. No.: 13/896,910

(22) Filed: May 17, 2013

(65) Prior Publication Data

US 2014/0223077 A1 Aug. 7, 2014

Related U.S. Application Data

(60) Provisional application No. 61/762,020, filed on Feb. 7, 2013.

(51) Int. Cl.
| | |
|---|---|
| *G06F 12/00* | (2006.01) |
| *G06F 13/16* | (2006.01) |
| *G11C 16/00* | (2006.01) |
| *G06F 12/02* | (2006.01) |

(52) U.S. Cl.
CPC .......... *G11C 16/00* (2013.01); *G06F 12/0246* (2013.01); *G06F 13/16* (2013.01); *G06F 13/1668* (2013.01)

(58) Field of Classification Search
CPC ... G06F 12/0246; G06F 13/16; G06F 13/1668
See application file for complete search history.

(56) References Cited

U.S. PATENT DOCUMENTS

| | | | | |
|---|---|---|---|---|
| 5,530,673 A | * | 6/1996 | Tobita | G06F 3/0601 711/E12.017 |
| 5,542,057 A | | 7/1996 | Omata | |
| 8,621,140 B2 | * | 12/2013 | Lee | G06F 3/061 710/260 |
| 2001/0053090 A1 | * | 12/2001 | Takata | G11C 11/005 365/185.08 |

(Continued)

FOREIGN PATENT DOCUMENTS

| | | |
|---|---|---|
| JP | 3-257665 | 11/1991 |
| JP | 2003-203490 | 7/2003 |

(Continued)

*Primary Examiner* — Aracelis Ruiz
(74) *Attorney, Agent, or Firm* — Oblon, McClelland, Maier & Neustadt, L.L.P.

(57) ABSTRACT

According to one embodiment, a memory system includes a nonvolatile memory, a command managing unit, a command issuing unit, a data control unit and a command monitoring unit. The command issuing unit issues a command received by the command managing unit to the nonvolatile memory. The data control unit controls a reading or writing of data to the nonvolatile memory. The command monitoring unit monitors the command managing unit and outputs a receipt signal to the data control unit when the command managing unit receives the command. The data control unit interrupts the reading or writing when receiving the receipt signal, issues the command from the command issuing unit to the nonvolatile memory, and resumes the reading or writing after issuing the command.

20 Claims, 9 Drawing Sheets

(56) References Cited

U.S. PATENT DOCUMENTS

| | | | |
|---|---|---|---|
| 2006/0041711 A1* | 2/2006 | Miura | G11C 11/4072 |
| | | | 711/103 |
| 2007/0239926 A1* | 10/2007 | Gyl | G11C 7/1075 |
| | | | 711/103 |
| 2011/0191527 A1 | 8/2011 | Fukuda | |
| 2011/0258367 A1 | 10/2011 | Tanaka et al. | |
| 2012/0011303 A1 | 1/2012 | Iwasaki et al. | |
| 2012/0144094 A1 | 6/2012 | Harasawa et al. | |
| 2012/0159051 A1 | 6/2012 | Hida et al. | |
| 2012/0278664 A1* | 11/2012 | Kazui | G06F 12/0246 |
| | | | 714/48 |
| 2012/0324147 A1* | 12/2012 | Lai | G06F 13/4291 |
| | | | 711/103 |

FOREIGN PATENT DOCUMENTS

| | | |
|---|---|---|
| JP | 2011-159070 | 8/2011 |
| JP | 2011-227664 | 11/2011 |
| JP | 2012-18626 | 1/2012 |
| JP | 2012-118784 | 6/2012 |
| JP | 2012-128646 | 7/2012 |
| JP | 2012-141944 | 7/2012 |
| JP | 2012-234363 A | 11/2012 |

* cited by examiner

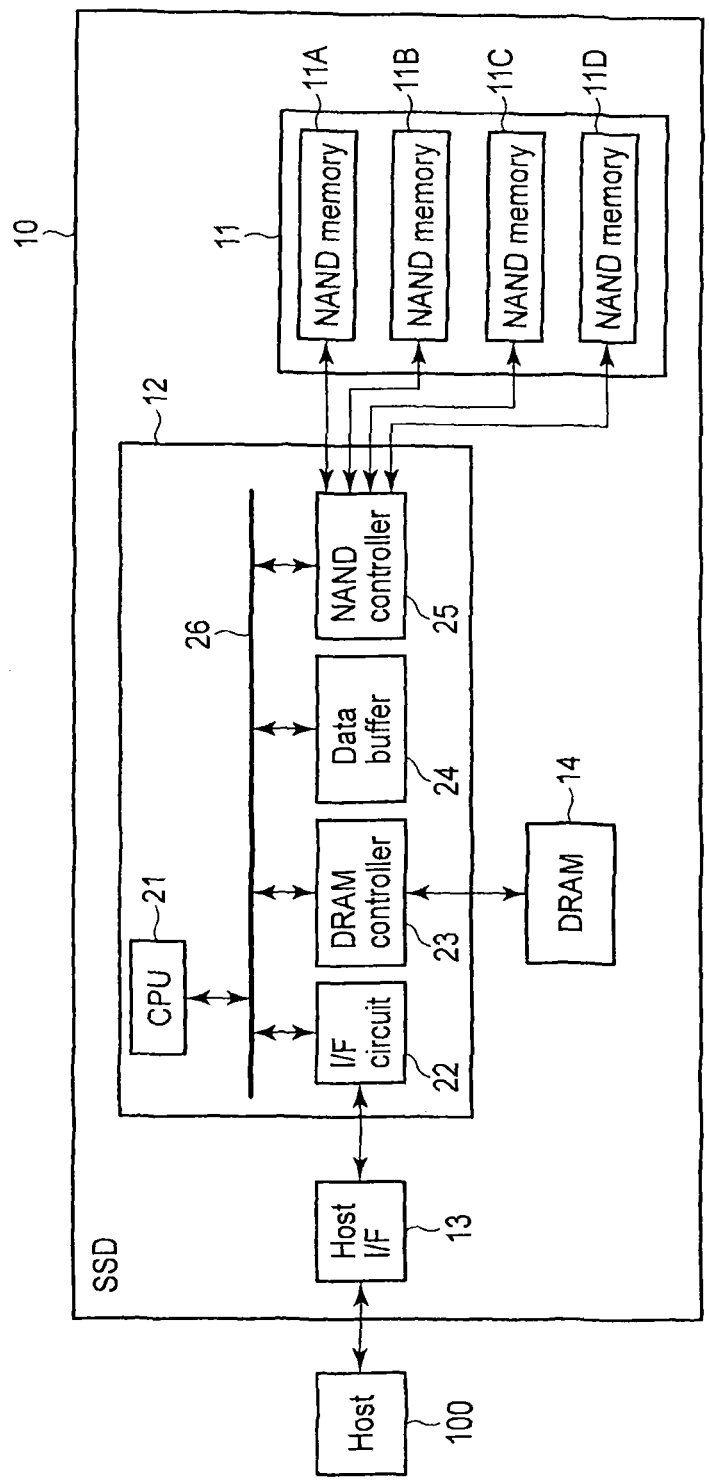
F I G. 1

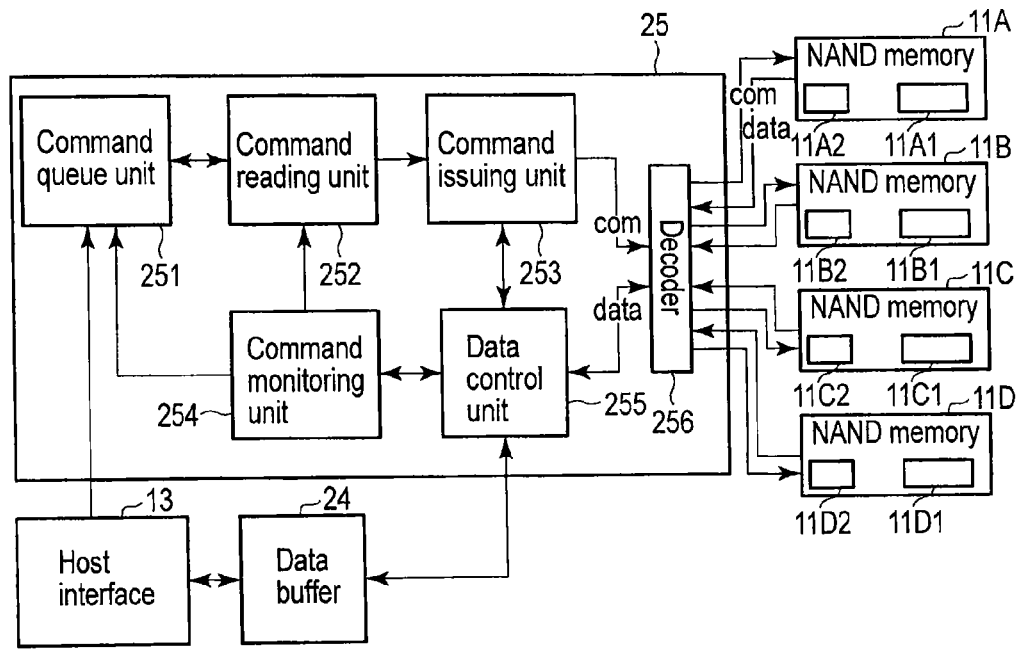
F I G. 2
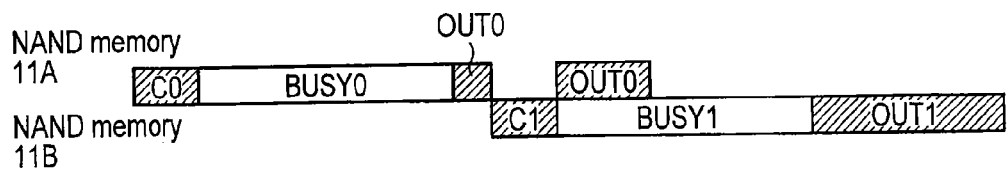
F I G. 3
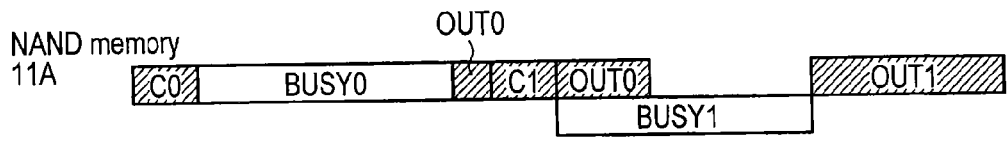
F I G. 4

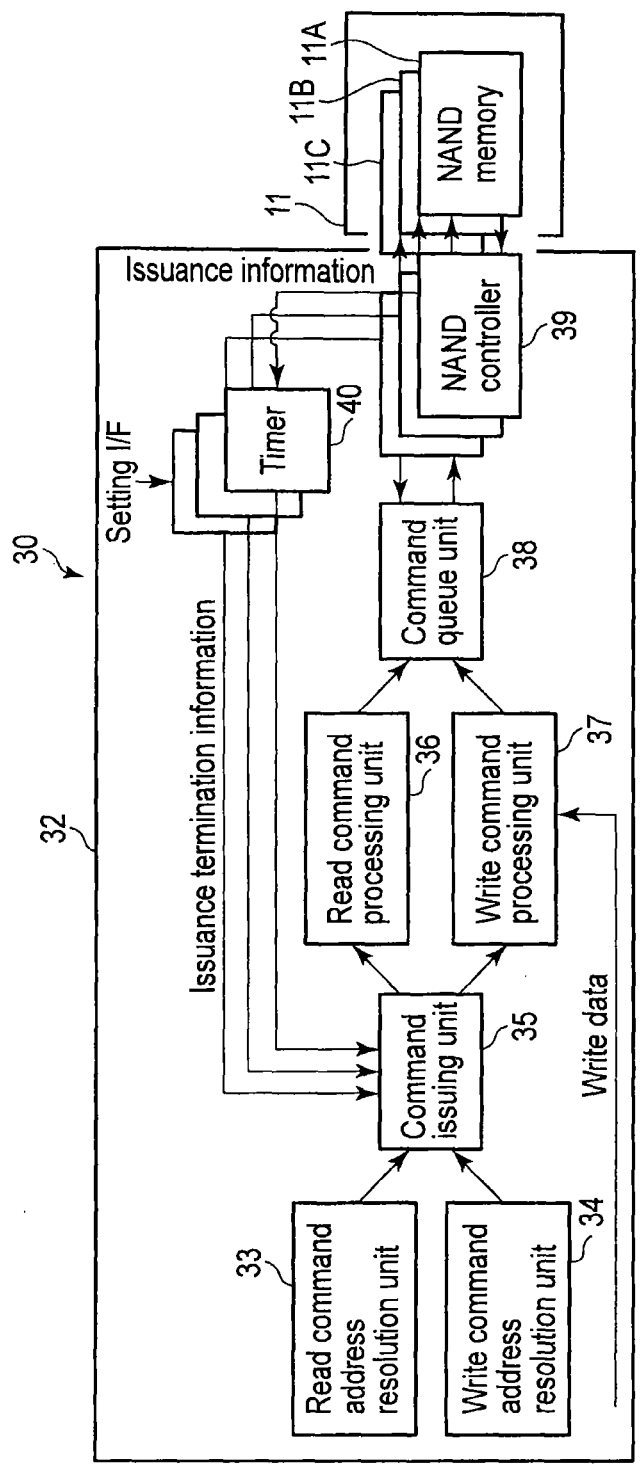
F I G. 8
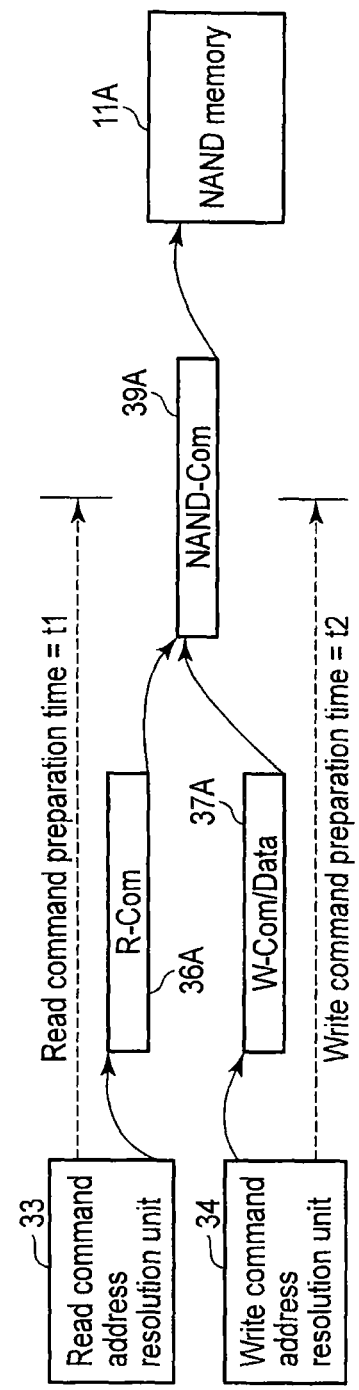
F I G. 9

MEMORY SYSTEM INCLUDING NONVOLATILE MEMORY

CROSS-REFERENCE TO RELATED APPLICATIONS

This application claims the benefit of U.S. Provisional Application No. 61/762,020, filed Feb. 7, 2013, the entire contents of which are incorporated herein by reference.

FIELD

Embodiments described herein relate generally to a memory system including a nonvolatile memory.

BACKGROUND

Recently, increasingly stringent demands for performance have been placed on a memory system that uses a NAND type flash memory (hereinafter referred to as a NAND memory) as a nonvolatile memory, for example, a solid state drive (SSD) system. For higher performance without a cost increase, the development of a NAND controller that makes the most use of the NAND memory will be more important.

Meanwhile, a NAND package (including the NAND memory) used in an SSD generally includes a plurality of NAND chips to hold down the number of external pins and to enhance performance and capacity. In the SSD of this type, a plurality of NAND memories need to be more efficiently used.

BRIEF DESCRIPTION OF THE DRAWINGS

FIG. 1 is a block diagram showing the configuration of an SSD according to a first embodiment;

FIG. 2 is a block diagram showing the configurations of a NAND controller and a nonvolatile semiconductor memory in reading according to the first embodiment;

FIG. 3 is a time diagram showing an operation of the nonvolatile semiconductor memory in reading according to the first embodiment;

FIG. 4 is a time diagram showing another operation of the nonvolatile semiconductor memory in reading according to the first embodiment;

FIG. 8 is a block diagram showing the configurations of an SSD controller and a nonvolatile semiconductor memory according to a second embodiment;

FIG. 9 is a block diagram showing the flows of commands and buffers in the SSD controller according to the second embodiment;

DETAILED DESCRIPTION

Figure 5:
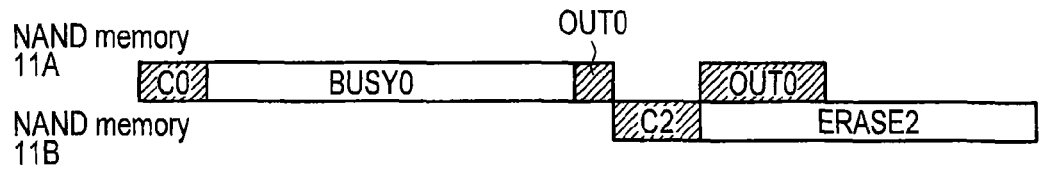
FIG. 5 is a time diagram showing an operation of the nonvolatile semiconductor memory in reading and erasing according to the first embodiment.

Hereinafter, a memory system according to embodiments is described with reference to the drawings. Although a solid state drive (SSD) is described here as an example of the memory system, the present embodiments are not exclusively applied to the SSD. In the explanation below, components having the same functions and configurations are denoted with the same reference signs and are only repeatedly described when necessary.

In general, according to one embodiment, a memory system includes a nonvolatile memory, a command managing unit, a command issuing unit, a data control unit and a command monitoring unit. The nonvolatile memory is configured to store data. The command managing unit is configured to receive and manage a command. The command issuing unit is configured to issue the command received by the command managing unit to the nonvolatile memory. The data control unit is configured to control an operation that is one of reading and writing of data to the nonvolatile memory. The command monitoring unit is configured to monitor the command managing unit and output a receipt signal to the data control unit when the command managing unit receives the command. The data control unit interrupts the operation that is one of the reading and writing when receiving the receipt signal from the command monitoring unit, issues the command from the command issuing unit to the nonvolatile memory, and resumes the operation that is one of the reading and writing after issuing the command.

First Embodiment

A solid state drive (SSD) according to the first embodiment is described.

FIG. 1 is a block diagram showing the configuration of the SSD according to the first embodiment.

A solid state drive (SSD) 10 is connected to a host device (hereinafter referred to as a host) 100, for example, a personal computer or a server by a communication interface of, for example, an advanced technology attachment (ATA) standard. The SSD 10 functions as an external storage unit of the host 100.

The SSD 10 includes a nonvolatile semiconductor memory 11, an SSD controller 12, a host interface (I/F) 13, and a nonvolatile semiconductor memory (e.g., DRAM) 14.

The host 100 reads or writes data in the nonvolatile semiconductor memory 11, and the data is stored in the nonvolatile semiconductor memory 11. The nonvolatile semiconductor memory 11 includes, for example, a NAND type flash memory (hereinafter referred to as a NAND memory), a NOR type flash memory, a magnetic random access memory (MRAM), or a resistive random access memory (ReRAM). Moreover, the nonvolatile semiconductor memory 11 may be, for example, a single package including one or more semiconductor chips, or a plurality of packages each including one or more semiconductor chips. The nonvolatile semiconductor memory 11 may otherwise be a flip chip of a single semiconductor chip.

In the present embodiment, the nonvolatile semiconductor memory 11 includes a plurality of NAND memories 11A, 11B, 11C, and 11D. Each of the NAND memories is a package including a single semiconductor chip. The NAND memory 11A includes a memory circuit 11A1 and a buffer 11A2. Similarly, the NAND memory 11B includes a memory circuit 11B1 and a buffer 11B2, the NAND memory 11C includes a memory circuit 11C1 and a buffer 11C2, and the NAND memory 11D includes a memory circuit 11D1 and a buffer 11D2. The memory circuit includes a plurality of nonvolatile memory cells for storing data. The buffer temporarily holds data to be input to or output from the memory circuit.

The SSD controller 12 controls the operation of the whole SSD including the nonvolatile semiconductor memory 11 and the nonvolatile semiconductor memory 14 in accordance with a signal input from the host 100 via the host interface 13. The SSD controller 12 includes a CPU 21, an interface (I/F) circuit 22, a DRAM controller 23, a data buffer 24, and a NAND controller 25 that are connected by a bus 26.

The CPU 21 processes various programs and computations, and controls the operation of the SSD controller 12. The interface circuit 22 transfers signals between the host interface 13 and the SSD controller 12. The DRAM controller 23 controls the operation of the nonvolatile semiconductor memory (DRAM) 14. The data buffer 24 is used to temporarily store data transferred to the host 100 or the nonvolatile semiconductor memory 11. Moreover, the NAND controller 25 controls the operations of the NAND memories 11A, 11B, 11C, and 11D in the nonvolatile semiconductor memory 11.

The host interface 13 transfers signals between the SSD 10 and the host 100. The nonvolatile semiconductor memory 14 is used to temporarily store transferred data, for example, to retain management information for the nonvolatile semiconductor memory 11 and to cache data. The nonvolatile semiconductor memory 14 includes, for example, a DRAM or an SRAM.

Data transmitted from the host 100 to the host interface 13 is temporarily stored in the data buffer 24 under the control of the CPU 21. The data is then transferred from the data buffer 24, and written into the NAND memory in the nonvolatile semiconductor memory 11. In the meantime, data read from the NAND memory is temporarily stored in the data buffer 24. The data is then transmitted from the data buffer 24 to the host 100 via the host interface 13.

FIG. 2 is a block diagram showing the configurations of the NAND controller 25 and the nonvolatile semiconductor memory 11 in reading according to the first embodiment.

As shown, the NAND controller 25 includes a command queue unit 251, a command reading unit 252, a command issuing unit 253, a command monitoring unit 254, a data control unit 255, and a decoder 256. The host interface 13 is connected to the command queue unit 251 and the data buffer 24. The command issuing unit 253 and the data control unit 255 are each connected to the NAND memories 11A, 11B, 11C, and 11D via the decoder 256. The decoder 256 selects one of the NAND memories 11A, 11B, 11C, and 11D in the nonvolatile semiconductor memory 11 in accordance with an address.

First, a command is input to the command queue unit 251 from the host 100 via the host interface 13. The command queue unit 251 stores and manages the received command. The command reading unit 252 reads the command from the command queue unit 251, and transfers the command to the command issuing unit 253. The command issuing unit 253 issues the command received from the command reading unit 252 to the NAND memory in the nonvolatile semiconductor memory 11 via the decoder 256. The decoder outputs the command issued from the command issuing unit 253 to the NAND memory in accordance with an address. The command queue unit 251 and the command reading unit 252 constitute a command managing unit.

FIG. 3 is a time diagram showing an operation of the nonvolatile semiconductor memory in reading according to the first embodiment. Here, the operations and control of the NAND memory 11A and the NAND memory 11B in reading are shown.

The command reading unit 252 reads a command from the command queue unit 251, and the command issuing unit 253 issues the command received from the command reading unit 252 to the NAND memory 11A via the decoder 256. In the meantime, the data control unit 255 monitors the command input status and busy status of each NAND memory, and shifts to a data reading operation as soon as the data control unit 255 finds data that can be read.

The command monitoring unit 254 monitors the arrival of a new command at the command queue unit 251. Upon finding the new command that has not been read by the command reading unit 252, the command monitoring unit 254 reports this command to the command reading unit 252. The data control unit 255 checks the report from the command monitoring unit 254 at regular intervals during a period including the data reading period. If there is a new command and this command can be input to the NAND memory, the data control unit 255 interrupts the data reading and issues a command.

Inputting of read commands C0 and C1 to the NAND memories 11A and 11B is described below in detail with reference to FIG. 3.

First, the command issuing unit 253 issues the read command C0 to the NAND memory 11A via the decoder 256. In a period C0, the NAND memory 11A receives the read command C0. In a period BUSY0, the NAND memory 11A then takes data from the memory circuit 11A1 into the buffer 11A2 therein. In a period OUT0, the data in the buffer 11A2 in the NAND memory 11A is then read by the data control unit 255.

In the above-mentioned period, the command monitoring unit 254 monitors the arrival of a new command at the command queue unit 251. Upon finding the arrival of the read command C1, the command monitoring unit 254 reports the command to the command reading unit 252 and the data control unit 255. On receipt of the report from the command monitoring unit 254, the command reading unit 252 reads the read command C1 from the command queue unit 251, and outputs the read command C1 to the command issuing unit 253.

The data control unit 255 checks the report from the command monitoring unit 254. If the read command C1 is found as a new command and this read command C1 can be input to the NAND memory 11B, the data control unit 255 interrupts the reading of data in the period OUT0. Checking that the reading of data by the data control unit 255 is interrupted, the command issuing unit 253 issues the read command C1 to the NAND memory 11B. The data control unit 255 then checks that the issuance of the read command C1 by the command issuing unit 253 has been finished, and the data control unit 255 resumes the reading of data from the buffer 11A2 in the NAND memory 11A.

That is, the reading of data in the period OUT0 is interrupted in the NAND memory 11A, and the NAND memory 11B receives the read command C1 in a period C1. When the receipt of the read command C1 is finished, the reading of data in the period OUT0 is resumed in the NAND memory 11A. After receiving the read command C1, the NAND memory 11B takes data from the memory circuit 11B1 into the buffer 11B2 therein in a period BUSY1.

Here, the reading of data in the NAND memory 11A in the period OUT0 is parallel to the taking of data in the NAND memory 11B in the period BUSY1. This allows data to be read from the NAND memories 11A and 11B into the NAND controller 25 in a short period by the read commands C0 and C1. That is, the time required to read data from a plurality of NAND memories into the NAND controller can be reduced. As a result, a plurality of NAND memories can be more efficiently used in reading.

No command can be input to the NAND memory during the reading of data from the buffer in the NAND memory into the NAND controller or during the input of another command. That is, in the period C0 and the period OUT0 in FIG. 3, an interconnect line between the NAND controller 25 and the NAND memory 11A is used, so that no command can be input to the NAND memory 11B.

Although the read commands C0 and C1 are input to the different NAND memories 11A and 11B in the case described with reference to FIG. 3, the read commands C0 and C1 are input to one NAND memory 11A in the example described below.

FIG. 4 is a time diagram showing another operation of the nonvolatile semiconductor memory in reading according to the first embodiment. Here, the operation and control of the NAND memory 11A in reading are shown.

First, the command issuing unit 253 issues the read command C0 to the NAND memory 11A via the decoder 256. In the period C0, the NAND memory 11A receives the read command C0. In the period BUSY0, the NAND memory 11A then takes data from the memory circuit 11A1 into the buffer 11A2 therein. In the period OUT0, the data in the buffer 11A2 in the NAND memory 11A is then read by the data control unit 255.

In the above-mentioned period, the command monitoring unit 254 monitors the arrival of a new command at the command queue unit 251. Upon finding the arrival of the read command C1, the command monitoring unit 254 reports the command to the command reading unit 252 and the data control unit 255. On receipt of the report from the command monitoring unit 254, the command reading unit 252 reads the read command C1 from the command queue unit 251, and outputs the read command C1 to the command issuing unit 253.

The data control unit 255 checks the report from the command monitoring unit 254. If the read command C1 is found as a new command and this read command C1 can be input to the NAND memory 11A, the data control unit 255 interrupts the reading of data in the period OUT0. Checking that the reading of data by the data control unit 255 is interrupted, the command issuing unit 253 issues the read command C1 to the NAND memory 11A. The data control unit 255 then checks that the issuance of the read command C1 by the command issuing unit 253 has been finished, and the data control unit 255 resumes the reading of data from the buffer 11A2 in the NAND memory 11A.

That is, the reading of data in the period OUT0 is interrupted in the NAND memory 11A, and the NAND memory 11A receives the read command C1 in the period C1. When the receipt of the read command C1 is finished, the reading of data in the period OUT0 is resumed in the NAND memory 11A. After receiving the read command C1, the NAND memory 11A takes data from the memory circuit 11A1 into the buffer 11A2 therein in the period BUSY1.

Here, in the NAND memory 11A, the reading of data in the period OUT0 is parallel to the taking of data in the period BUSY1. This allows data to be read from the NAND memory 11A into the NAND controller 25 in a short period by the read command C0 and also allows data to be taken from the memory circuit 11A1 into the buffer 11A2 in the NAND memory 11A in a short period by the read command C1. That is, the time required to read data from the NAND memory into the NAND controller can be reduced. As a result, the NAND memory can be more efficiently used in reading.

Now, an example is described with reference to FIG. 5 to show how the read command C0 is input to the NAND memory 11A and how an erase command C2 is input to the NAND memory 11B.

FIG. 5 is a time diagram showing an operation of the nonvolatile semiconductor memory in reading and erasing according to the first embodiment. Here, the operations and control of the NAND memories 11A and 11B in reading and erasing are shown.

First, the command issuing unit 253 issues the read command C0 to the NAND memory 11A via the decoder 256. In the period C0, the NAND memory 11A receives the read command C0. In the period BUSY0, the NAND memory 11A then takes data from the memory circuit 11A1 into the buffer 11A2 therein. In the period OUT0, the data in the buffer 11A2 in the NAND memory 11A is then read by the data control unit 255.

In the above-mentioned period, the command monitoring unit 254 monitors the arrival of a new command at the command queue unit 251. Upon finding the arrival of the erase command C2, the command monitoring unit 254 reports the command to the command reading unit 252 and the data control unit 255. On receipt of the report from the command monitoring unit 254, the command reading unit 252 reads the erase command C2 from the command queue unit 251, and outputs the erase command C2 to the command issuing unit 253.

The data control unit 255 checks the report from the command monitoring unit 254. If the erase command C2 is found as a new command and this erase command C2 can be input to the NAND memory 11B, the data control unit 255 interrupts the reading of data in the period OUT0. Checking that the reading of data by the data control unit 255 is interrupted, the command issuing unit 253 issues the erase command C2 to the NAND memory 11B. The data control unit 255 then checks that the issuance of the erase command C2 by the command issuing unit 253 has been finished, and the data control unit 255 resumes the reading of data from the buffer 11A2 in the NAND memory 11A.

That is, the reading of data in the period OUT0 is interrupted in the NAND memory 11A, and the NAND memory 11B receives the erase command C2 in a period C2. When the receipt of the erase command C2 is finished, the reading of data is resumed in the period OUT0 in the NAND memory 11A. In the NAND memory 11B, after the receipt of the erase command C2, data is erased from a block of the memory circuit 11B1 in a period ERASE2.

Here, the reading of data in the NAND memory 11A in the period OUT0 is parallel to the erasing of data in the NAND memory 11B in the period ERASE2. This allows data to be read from the NAND memory 11A into the NAND controller 25 in a short period by the read command C0 and also allows data to be erased in the memory circuit 11B1 in a short period by the erase command C2. That is, the time required to read data from and erase data in a plurality of NAND memories can be reduced. As a result, a plurality of NAND memories can be more efficiently used in reading and erasing.

Now, an example is described with reference to FIG. 6 to show how a write command C3 is input to the NAND memory 11A and how a read command C4 is input to the NAND memory 11B.

Figure 6:
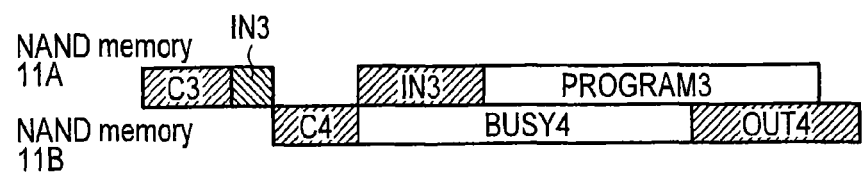
FIG. 6 is a time diagram showing an operation of the nonvolatile semiconductor memory in writing and reading according to the first embodiment.

FIG. 6 is a time diagram showing an operation of the nonvolatile semiconductor memory in writing and reading according to the first embodiment. Here, the operations and control of the NAND memories 11A and 11B in writing and reading are shown.

First, the command issuing unit 253 issues the write command C3 to the NAND memory 11A via the decoder 256. In a period C3, the NAND memory 11A receives the write command C3. In a period IN3, the NAND memory 11A then receives data in the buffer 11A2 therein from the data control unit 255. In a period PROGRAM3, the NAND memory 11A writes data into the memory circuit 11A1 therein from the buffer 11A2.

In the above-mentioned period, the command monitoring unit 254 monitors the arrival of a new command at the command queue unit 251. Upon finding the arrival of the read command C4, the command monitoring unit 254 reports the command to the command reading unit 252 and the data control unit 255. On receipt of the report from the command monitoring unit 254, the command reading unit 252 reads the read command C4 from the command queue unit 251, and outputs the read command C4 to the command issuing unit 253.

The data control unit 255 checks the report from the command monitoring unit 254. If the read command C4 is found as a new command and this read command C4 can be input to the NAND memory 11B, the data control unit 255 interrupts the transfer of data in the period IN3. Checking that the transfer of data by the data control unit 255 is interrupted, the command issuing unit 253 issues the read command C4 to the NAND memory 11B. The data control unit 255 then checks that the issuance of the read command C4 by the command issuing unit 253 has been finished, and the data control unit 255 resumes the transfer of data to the buffer 11A2 in the NAND memory 11A.

That is, the transfer of data in the period IN3 is interrupted in the NAND memory 11A, and the NAND memory 11B receives the read command C4 in a period C4. When the receipt of the read command C4 is finished, the transfer of data in the period IN3 is resumed in the NAND memory 11A. After receiving the read command C4, the NAND memory 11B takes data from the memory circuit 11B1 into the buffer 11B2 therein in a period BUSY4.

Here, the transfer of data in the NAND memory 11A in the period IN3 is parallel to the taking of data in the NAND memory 11B in the period BUSY4. This allows data to be transferred from the NAND controller 25 to the NAND memory 11A in a short period by the write command C3 and also allows data to be taken from the memory circuit 11B1 into the buffer 11B2 in the NAND memory 11B in a short period by the read command C4. That is, the time required to write data into and read data from a plurality of NAND memories can be reduced. As a result, a plurality of NAND memories can be more efficiently used in writing and reading.

In the cases described with reference to FIGS. 3 and 4, the command C1 is input from the host 100 in a period in which data in the buffer in the NAND memory 11A is read by the data control unit 255. However, the host 100 may input the command C1 in a period in which the NAND memory 11A is in operation and a command can be input without the interruption of the operation of the NAND memory 11A. For example, the host 100 may input the command C1 to the command queue unit 251 in a period in which data is taken from the memory circuit 11A1 into the buffer 11A2 in the NAND memory 11A.

Figure 7:
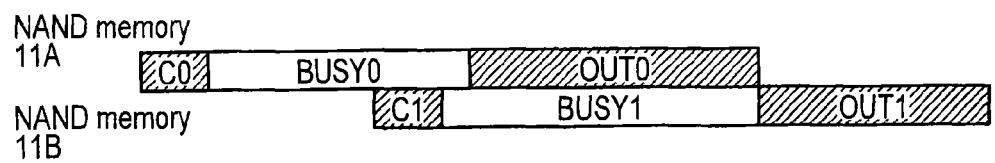
FIG. 7 is a time diagram showing another operation of the nonvolatile semiconductor memory in reading according to the first embodiment.

FIG. 7 is a time diagram showing another operation of the nonvolatile semiconductor memory in reading according to the first embodiment. Here, the operations and control of the NAND memories 11A and 11B in reading are shown.

First, the command issuing unit 253 issues the read command C0 to the NAND memory 11A via the decoder 256. In the period C0, the NAND memory 11A receives the read command C0. In the period BUSY0, the NAND memory 11A then takes data from the memory circuit 11A1 into the buffer 11A2 therein. In the period OUT0, the data in the buffer 11A2 in the NAND memory 11A is then read by the data control unit 255.

In the above-mentioned operating period of the NAND memory 11A, the host 100 inputs the read command C1 to the command queue unit 251 via the host interface 13 in the period BUSY0. The command monitoring unit 254 monitors the arrival of a new command at the command queue unit 251. Upon finding the arrival of the read command C1, the command monitoring unit 254 reports the command to the command reading unit 252 and the data control unit 255. On receipt of the report from the command monitoring unit 254, the command reading unit 252 reads the read command C1, and outputs the read command C1 to the command issuing unit 253.

As described above, the read command C1 is input to the command queue unit 251 from the host 100 in the period BUSY0, so that the command issuing unit 253 issues the received read command C1 directly to the NAND memory 11B. The data control unit 255 then starts the reading of data from the buffer 11A2 in the NAND memory 11A. In the meantime, the NAND memory 11B takes data from the memory circuit 11B1 into the buffer 11B2 in the period BUSY1 after receiving the read command C1. The data control unit 255 then starts the reading of data from the buffer 11B2 in the NAND memory 11B.

That is, the NAND memory 11A takes data from the memory circuit 11A1 into the buffer 11A2 in the period BUSY0 after receiving the command C0. In the period BUSY0, the NAND memory 11B receives the command C1 input from the host 100. In this way, the host 100 inputs the command C1 in the period BUSY0, so that in the NAND memories 11A and 11B, the operation in the period BUSY0 and the operation in the period BUSY1 are performed in parallel, and the operation in the period OUT0 and the operation in the period BUSY1 are performed in parallel.

This allows data to be read from the NAND memories 11A and 11B into the NAND controller 25 in a short period by the read commands C0 and C1. That is, the time required to read data from a plurality of NAND memories into the NAND controller can be reduced. As a result, a plurality of NAND memories can be more efficiently used in reading.

A conventional NAND controller does not check whether a new command is input during the reading of prepared data, and therefore processes the new command after the reading of the data when the new command is input. This prevents parallel processing and leads to deterioration in performance even when processing can normally be performed in the NAND memory parallel to the reading of data.

For example, two NAND chips, a chip A and a chip B are used to perform read processing. In this case, when a period in which a command for the chip B can be input comes while the chip A is busy, read processing for the chip A and the chip B can be performed in parallel. On the other hand, when a period in which a command for the chip B can be input comes during the reading of data from the chip A, the command cannot be input during the reading of the data, so that the controller needs to input the command after waiting for the data to be read. Accordingly, the chip B is less efficiently used.

According to the first embodiment described above, in the period OUT0, the reading of data from the NAND memory 11A is discontinued, and the read command C1 is input to the NAND memory 11B. When the input of the read command C1 is finished, the reading of data from the NAND memory 11A in the period OUT0 is resumed. The NAND memory 11B takes data from the memory circuit into the buffer therein in the period BUSY1 after receiving the read command C1.

Here, the reading of data in the NAND memory 11A in the period OUT0 is parallel to the taking of data in the NAND memory 11B in the period BUSY1. Thus, the time required to read data from the NAND memories 11A and 11B into the NAND controller 25 in response to the read commands C0 and C1 can be reduced.

As described above, according to the first embodiment, the operational performance of the nonvolatile memory in reading, writing, and erasing can be enhanced, and the SSD can be more efficiently used.

Second Embodiment

An SSD according to the second embodiment is described. In the second embodiment, the termination of a command in a nonvolatile memory is estimated, and the termination of the command is reported to a command issuing unit in advance. As a result, two stages of command buffers that have been required can be reduced to one stage of a command buffer.

FIG. 8 is a block diagram showing the configuration of an SSD controller and a nonvolatile semiconductor memory according to the second embodiment.

As shown, an SSD 30 includes a nonvolatile semiconductor memory 11 and an SSD controller 32. The SSD controller 32 includes a read command address resolution unit 33, a write command address resolution unit 34, a command issuing unit 35, a read command processing unit 36, a write command processing unit 37, a command queue unit 38, a NAND controller 39, and a timer 40. The nonvolatile semiconductor memory 11 includes, for example, a plurality of NAND type flash memories (hereinafter referred to as NAND memories) 11A, 11B, and 11C.

The read command address resolution unit 33 acquires an address in accordance with a signal input from a host. If the address is resolved in the read command address resolution unit 33, a read command is input to the command issuing unit 35, and then issued from the command issuing unit 35 to the read command processing unit 36.

The read command is then processed in the read command processing unit 36, and output to the command queue unit 38. The command queue unit 38 stores and manages the received read command. Further, the read command is output to the NAND controller 39 from the command queue unit 38.

Similarly, the write command address resolution unit 34 acquires an address in accordance with a signal input from the host. If the address is resolved in the write command address resolution unit 34, a write command is input to the command issuing unit 35, and then issued from the command issuing unit 35 to the write command processing unit 37.

The write command is then processed in the write command processing unit 37, and output to the command queue unit 38. The command queue unit 38 stores and manages the received write command. Further, the write command is output to the NAND controller 39 from the command queue unit 38.

The NAND controller 39 issues the command received from the command queue unit 38 to one of the NAND memories 11A, 11B, and 11C. The NAND controller 39 also outputs, as issuance information, the issued command and information on the NAND memory to which the command is issued, to the timer 40.

In accordance with the issuance information, the timer 40 outputs, to the command issuing unit 35, advance termination information including the command to be terminated and the NAND memory. The command issuing unit 35 issues a command in accordance with the advance termination information, and carries out command processing by the command processing unit. In this way, the termination time of the command is found, and the processing of a next command is carried out before the termination of the prior command, so that the next command can be immediately input to the NAND memory from the NAND controller 39 when the prior command is terminated.

FIG. 9 is a block diagram showing the flows of commands and buffers in the SSD controller 32 according to the second embodiment.

If an address is resolved in the read command address resolution unit 33, a read command R-Com is issued from the command issuing unit 35, and stored in a buffer 36A of the read command processing unit 36. The read command processing unit 36 has one stage of the buffer 36A for storing the read command.

The read command R-Com is then output to the NAND controller 39 from the buffer 36A via the command queue unit 38, and stored in a buffer 39A of the NAND controller 39. The read command R-Com is then input to, for example, the NAND memory 11A.

Similarly, if an address is resolved in the write command address resolution unit 34, a write command W-Com is output from the command issuing unit 35, and stored in a buffer 37A of the write command processing unit 37. At the same time, write data is input to the write command processing unit 37 from the host, and stored in the buffer 37A of the write command processing unit 37. The write command processing unit 37 has one stage of the buffer 37A for storing the write command W-Com and the write data.

The write command W-Com is then output to the NAND controller 39 from the buffer 37A via the command queue unit 38, and stored in the buffer 39A of the NAND controller 39. The write command W-Com is then input to, for example, the NAND memory 11A. The write data is also input to the NAND memory 11A.

Here, times t1 and t2 are respectively required for the read command processing and the write command processing from the address resolution in the address resolution units 33 and 34 to the point where the commands can be issued to the NAND memory 11A. That is, the preparation time from the end of the address resolution to the point where the read command can be input to the NAND memory 11A is t1, and the preparation time from the end of the address resolution to the point where the write command can be input to the NAND memory 11A is t2. Here, t1<t2.

Now, the operation of the SSD 30 according to the second embodiment is described.

Figure 10:
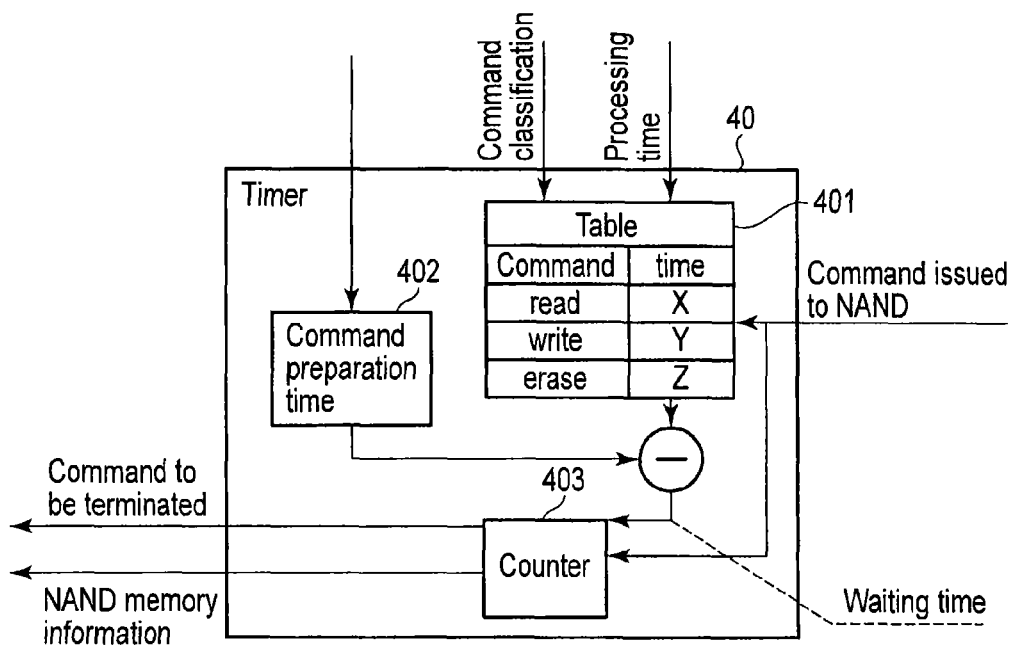
FIG. 10 is a block diagram showing the configuration of a timer in the SSD controller according to the second embodiment.

FIG. 10 is a block diagram showing the configuration of the timer 40 in the SSD controller 32 according to the second embodiment.

As shown in FIG. 10, the timer 40 includes a correspondence table 401, a per-command preparation time 402, and a counter 403.

The correspondence table 401 shows the correspondence between the commands (e.g., read, write, erase) and processing times. The processing times in the correspondence table 401 include a time X for the read command, a time Y for the write command, and a time Z for erasing. Command classifications and processing times are previously set in the correspondence table 401 by a setting interface.

As described above, the per-command preparation time 402 is t1 for the read command, t2 for the write command, and t3 for erasing.

The counter 403 counts a waiting time calculated from the correspondence table 401 and the per-command preparation time 402, and outputs, as the advance termination information, a command to be terminated and NAND memory information (e.g., the number of NAND memory chips).

Figure 11:
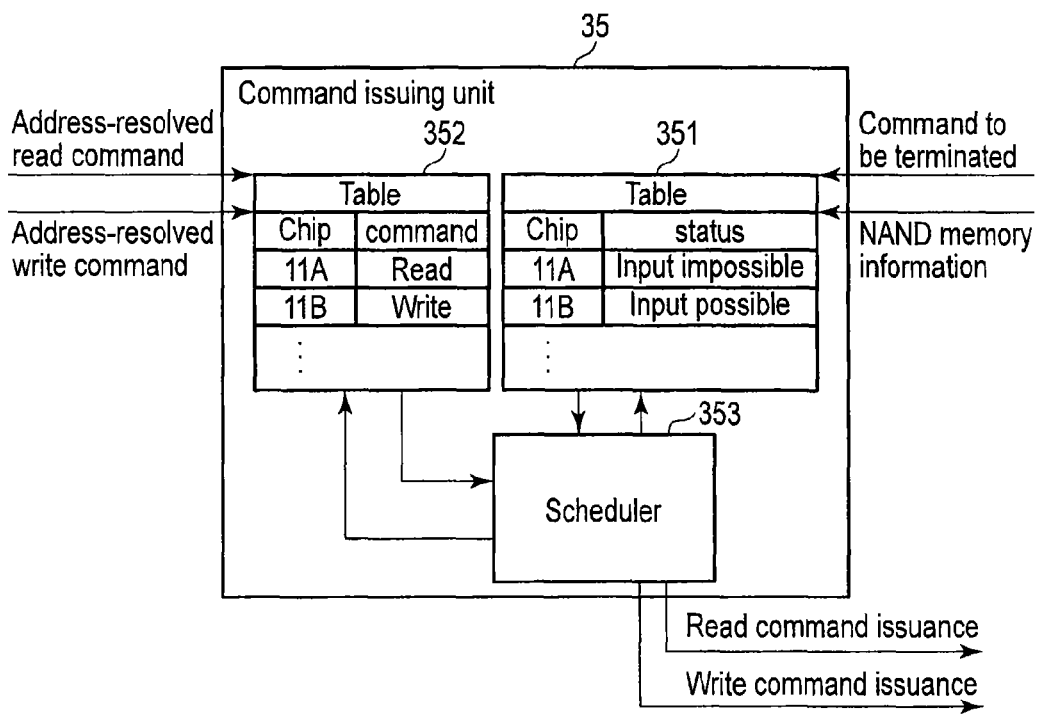
FIG. 11 is a block diagram showing the configuration of a command issuing unit in the SSD controller according to the second embodiment.

FIG. 11 is a block diagram showing the configuration of the command issuing unit 35 in the SSD controller 32 according to the second embodiment.

As shown in FIG. 11, the command issuing unit 35 includes a chip status table 351, a command receipt table 352, and a scheduler 353.

The chip status table 351 shows the correspondence between the NAND memories 11A, 11B, and 11C and statuses. That is, the chip status table 351 shows whether or not a command can be input for each NAND memory.

The command receipt table 352 shows commands output from the address resolution units 33 and 34 and their target NAND memories. The scheduler 353 finds an executable command from the chip status table 351 and the command receipt table 352, and issues the command to the command processing units 36 and 37.

The operation of the SSD 30 according to the second embodiment is as described below.

First, the NAND controller 39 issues the command received from the command queue unit 38 to the NAND memory 11A. The NAND controller 39 also outputs, as the issuance information, the issued command and information on the NAND memory to which the command is issued, to the timer 40.

The timer 40 refers to the correspondence table 401 and the per-command preparation time 402 to calculate a waiting time from the advance information, and starts the counter 403. The waiting time calculated by the timer 40 is found by the subtraction of the preparation time from the processing time of the command. For example, the waiting time is X−t1 for the read command, Y−t2 for the write command, and t3 for the erase command. The counter 403 counts the waiting time, and when the waiting time has passed, the counter 403 outputs a command to be terminated and NAND memory information to the command issuing unit 35.

The command issuing unit 35 updates information in the chip status table 351 in accordance with the command to be terminated and the NAND memory information. The scheduler 353 refers to the chip status table 351 and the command receipt table 352 to select a proper command and a NAND memory, that is, an executable command and its target NAND memory. The scheduler 353 further issues the selected command to the read command processing unit 36 or the write command processing unit 37 depending on the command classification.

A conventional SSD controller does not recognize when the NAND memory is available, that is, when the command in the NAND memory is terminated. Therefore, in order to prevent the decrease of operating speed, at least two stages of command buffers for storing commands are disposed in the conventional SSD controller. It is thus necessary to use the first stage buffer to respond to an immediate command and at the same time use the second stage buffer to prepare for the next command.

According to the second embodiment described above, it is possible to calculate the termination of a command in the NAND memory, and notify the command issuing unit of the termination of the command in advance. Thus, as the command issuing unit starts a command preparing operation in time even after receiving a command request, it is not necessary to store the command in the second stage buffer and prepare for the next request. As a result, two stages of command and data buffers (buffers for storing write data that have been required can be reduced to one stage of a command buffer. If the correspondence table 401 is rewritten by the setting interface, the per-command preparation time can be changed.

Third Embodiment

An SSD according to the third embodiment is described. In the example described according to the third embodiment, a waiting time is calculated in accordance with a per-command preparation time and an offset corresponding to information on the temperature or power consumption of a NAND memory.

Figure 12:
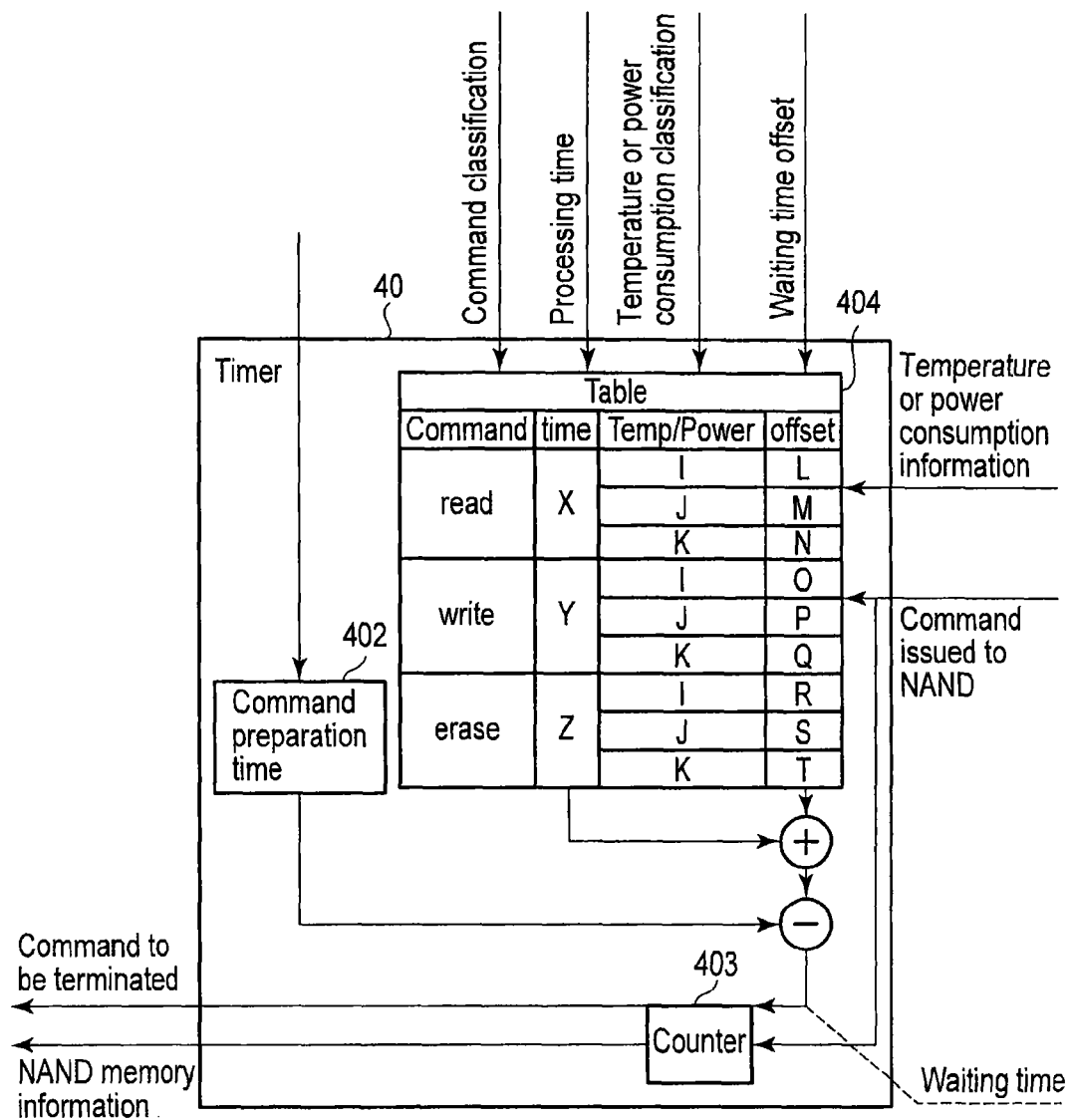
FIG. 12 is a block diagram showing the configuration of a timer in the SSD controller according to a third embodiment.

FIG. 12 is a block diagram showing the configuration of a timer 40 in an SSD controller 32 according to the third embodiment.

As shown in FIG. 12, the timer 40 includes a correspondence table 404, a per-command preparation time 402, and a counter 403. The correspondence table 404 shows the correspondence between commands (e.g., read, write, and erase) and processing times and between the commands and offsets corresponding to temperature information or power consumption information. Command classifications, processing times, temperature information or power consumption information, and waiting time offsets are previously set in the correspondence table 404 by a setting interface.

For example, three conditions I, J, and K are set for the offsets corresponding to the temperature information or the power consumption information for each command in accordance with the temperature (e.g., 25° C., 50° C., and 85° C.) or power consumption of the NAND memory. Moreover, offsets L, M, N, O, P, Q, R, S, and T correspond to the respective per-command conditions I, J, and K. The offsets are times added at command issuance intervals, and are added to the waiting time before the issuance when the corresponding command is issued.

The operation of an SSD 30 according to the third embodiment is as described below.

First, a NAND controller 39 issues the command received from a command queue unit 38 to the NAND memory 11A. The NAND controller 39 also outputs, as issuance information, the issued command and information on the NAND memory to which the command is issued, as well as temperature information or power consumption information, to the timer 40.

The timer 40 refers to the per-command processing time described in the correspondence table 404, the offset of the temperature information or the power consumption information, and the per-command preparation time 402 to calculate a waiting time from the advance information. More specifically, the timer 40 adds up the command processing time and the offset of the temperature information or the power consumption information, and subtracts a command preparation time from the additional value. In this way, the timer 40 calculates the waiting time. The timer 40 starts the counter 403 in accordance with the calculated waiting time. The counter 403 counts the waiting time, and when the waiting time has passed, the counter 403 outputs a command to be terminated and NAND memory information to a command issuing unit 35.

The command issuing unit 35 updates information in a chip status table 351 in accordance with the command to be terminated and the NAND memory information. The scheduler 353 refers to the chip status table 351 and a command receipt table 352 to select a proper command and a NAND memory, that is, an executable command and its target NAND memory. The scheduler 353 further issues the selected command to a read command processing unit 36 or a write command processing unit 37 depending on the command classification.

According to the third embodiment, it is possible to calculate the termination of a command in the NAND memory, and notify the command issuing unit of the termination of the command in advance, as in the second embodiment. As a result, two stages of command and data buffers (buffers for storing write data) that have been required can be reduced to one stage of a command buffer.

Furthermore, according to the third embodiment, the time to wait (offset) during command issuance is changed in accordance with the temperature information or the power consumption information. It is thereby possible to balance the operation performance and the temperature or power consumption of the NAND memory. The use of the third embodiment allows the intervals of commands input to the NAND memory to be finely controlled. Thus, the operation performance and the power consumption and temperature can be controlled depending on the situation.

If the correspondence table 404 is rewritten by the setting interface, whether to attach importance to the operation performance or the temperature or power consumption can be set in accordance with the external environment and customer demands.

Fourth Embodiment

In the fourth embodiment, an application example that uses the above-mentioned SSD is described.

Figure 13:
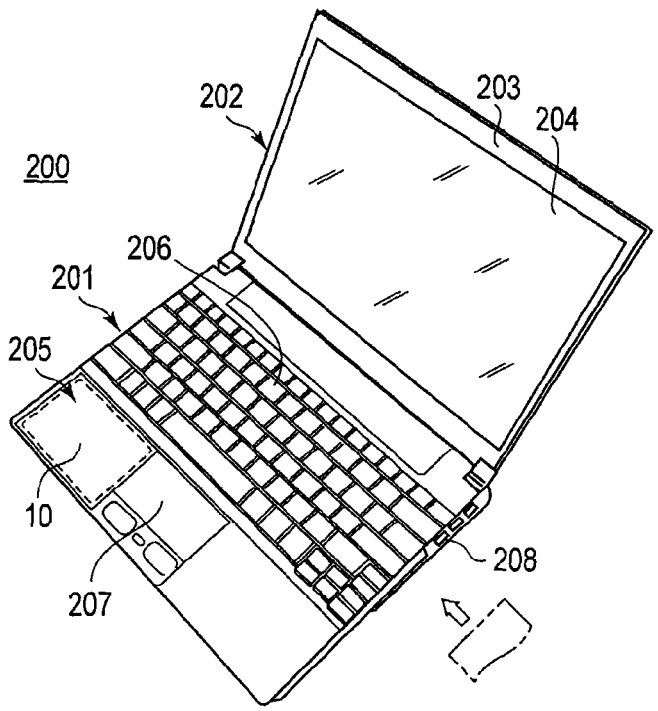
FIG. 13 is a perspective view showing an example of a personal computer provided with an SSD according to a fourth embodiment.

FIG. 13 is a perspective view showing an example of a personal computer provided with the SSD according to the fourth embodiment.

A personal computer 200 includes a body 201 and a display unit 202. The display unit 202 includes a display housing 203, and a display device 204 housed in the display housing 203.

The body 201 includes a case 205, a keyboard 206, and a touch pad 207 which is a pointing device. A main circuit substrate, an optical disk device (ODD) unit, a card slot, and an SSD 10 are housed in the case 205.

The card slot is provided adjacent to the peripheral wall of the case 205. An opening 208 facing the card slot is provided in the peripheral wall. A user can insert or remove an additional device into/from the card slot from outside of the case 205 through the opening 208.

The SSD 10 may be mounted and thus used in the personal computer 200 in place of a conventional hard disk drive (HDD), or may be inserted in the card slot of the personal computer 200 and used as an additional device.

Figure 14:
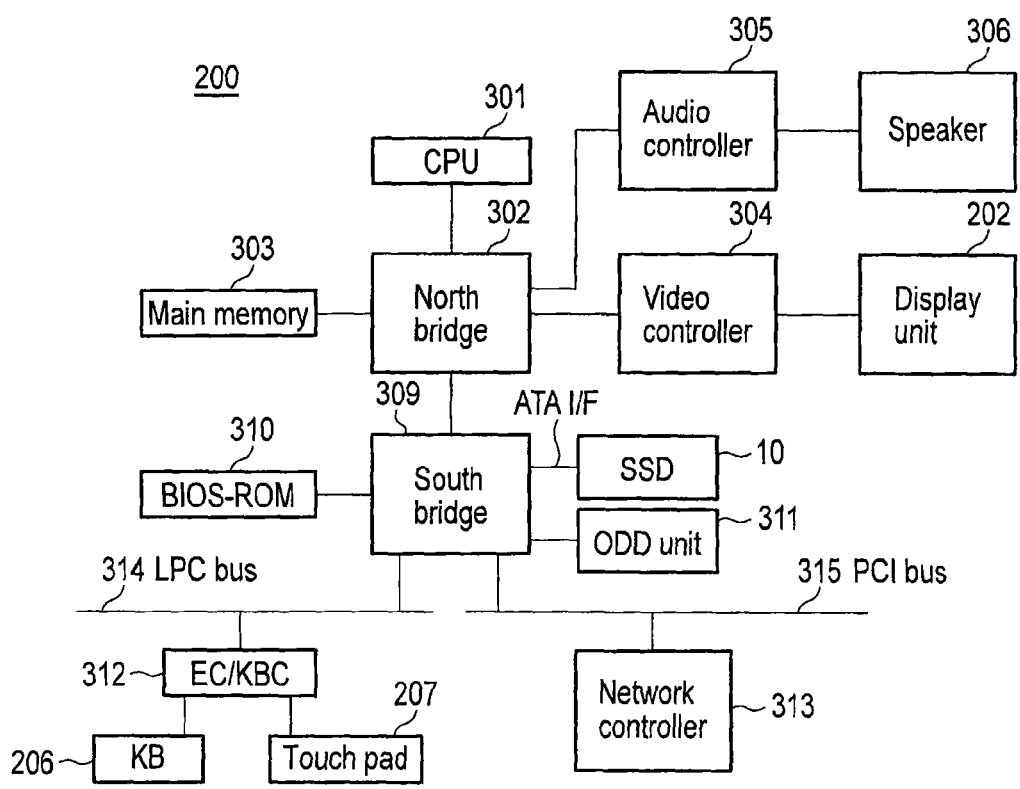
FIG. 14 is a block diagram showing a configuration example of the personal computer provided with the SSD according to the fourth embodiment.

FIG. 14 is a block diagram showing a configuration example of the personal computer provided with the SSD according to the fourth embodiment.

The personal computer 200 includes a CPU 301, a north bridge 302, a main memory 303, a video controller 304, an audio controller 305, a south bridge 309, a BIOS-ROM 310, the SSD 10, an ODD unit 311, an embedded controller/keyboard controller IC (EC/KBC) 312, and a network controller 313.

The CPU 301 is a processor provided to control the operation of the personal computer 200, and executes an operation system (OS) loaded into the main memory 303 from the SSD 10. When the ODD unit 311 enables at least one of reading processing and writing processing for a loaded optical disk, the CPU 301 executes this processing.

The CPU 301 also executes a basic input output system (BIOS) stored in the BIOS-ROM 310. The BIOS is a program for hardware control in the personal computer 200.

The north bridge 302 is a bridge device to connect a local bus of the CPU 301 and the south bridge 309. A memory controller for access control of the main memory 303 is also provided in the north bridge 302.

The north bridge 302 also has a function to communicate with the video controller 304, for example, via an accelerated graphic port (AGP) bus 314, and to communicate with the audio controller 305.

The main memory 303 serves to temporarily store a program or data, and functions as a work area of the CPU 301. The main memory 303 includes, for example, a RAM.

The video controller 304 is a video reproduction controller for controlling the display unit 202 used as a display monitor of the personal computer 200.

The audio controller 305 is an audio reproduction controller for controlling a speaker 306 of the personal computer 200.

The south bridge 309 controls devices on a low pin count (LPC) bus, and devices on a peripheral component interconnect (PCI) bus. The south bridge 309 controls, via an ATA interface, the SSD 10 which is a storage device for storing various kinds of software and data.

The personal computer 200 accesses the SSD 10 on a sector-basis. A write command, a read command, or a cache flash command is input to the SSD 10 via the ATA interface.

The south bridge 309 also has a function for access control of the BIOS-ROM 310 and the ODD unit 311.

The EC/KBC 312 is a one-chip microcomputer in which an embedded controller for electric power management and a keyboard controller for controlling the keyboard (KB) 206 and the touch pad 207 are integrated.

The EC/KBC 312 has a function to power on/off the personal computer 200 in accordance with the operation of a power button by the user. The network controller 313 is a communication device to communicate with an external network such as the Internet.

An application example in which the SSD according to the first embodiment is operated in the personal computer shown in FIGS. 13 and 14 is described. Device sleep, which shifts the SSD 10 to a power saving state, is described here.

Figure 15:
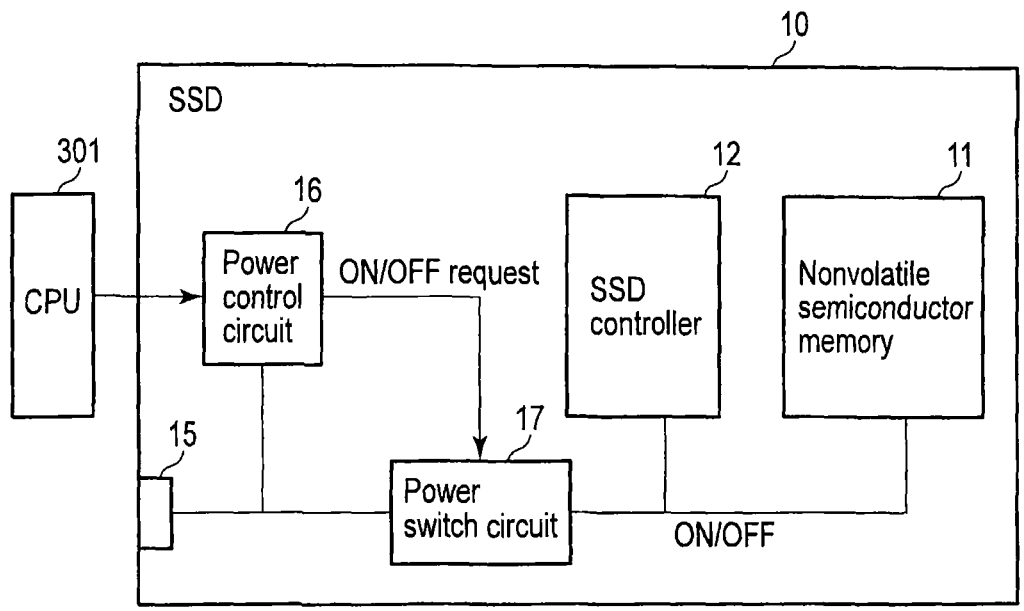
FIG. 15 is a block diagram showing the configuration of the SSD in which device sleep is performed in the personal computer.

FIG. 15 is a block diagram showing the configuration of the SSD in which the device sleep is performed in the personal computer.

A power supply voltage VDD is supplied to a power supply terminal 15 of the SSD 10. The power supply voltage VDD is also supplied to a power control circuit 16 and a power switch circuit 17 from the power supply terminal 15. The power control circuit 16 outputs a control signal for controlling the operation of the power switch circuit 17 to the power switch circuit 17 in accordance with a signal output from the CPU 301. The power switch circuit 17 is switched on or off by the control signal. When switched on, the power switch circuit 17 supplies the power supply voltage VDD to the SSD controller 12 and the nonvolatile semiconductor memory (e.g., NAND memory) 11. When switched off, the power switch circuit 17 stops the supply of the power supply voltage VDD to the SSD controller 12 and the nonvolatile semiconductor memory 11.

An example of operation when the device sleep is performed is described below.

A request to shift to the power saving state is made to the power control circuit 16 from the CPU 301 in the personal computer 200. In the power saving state, the power supply voltage is only supplied to the circuits (e.g., the power control circuit 16 and the power switch circuit 17) for controlling the supply of the power supply voltage VDD in the SSD 10, and the power supply voltage is not supplied to the other circuits (e.g., the SSD controller 12 and the nonvolatile semiconductor memory 11) in the SSD 10.

On receipt of the request to shift to the power saving state, the power control circuit 16 outputs, to the power switch circuit 17, a control signal (off request) to instruct to shut off the supply of the power supply voltage VDD. The power switch circuit 17 is switched off on receipt of the control signal (off request), and shuts off the supply of the power supply voltage VDD to the SSD controller 12 and the nonvolatile semiconductor memory 11. As a result, the SSD 10 is shifted to the power saving state.

On the other hand, when the SSD 10 is restored to a normal state from the power saving state, a request to restore to the normal state from the power saving state is made to the power control circuit 16 from the CPU 301. In the normal state, the power supply voltage is also supplied to the circuits (e.g., the SSD controller 12 and the nonvolatile semiconductor memory 11) other than the circuit for controlling the supply of the power supply voltage VDD in the SSD 10, and operation is normally performed.

On receipt of the request to restore to the normal state, the power control circuit 16 outputs, to the power switch circuit 17, a control signal (on request) to instruct to supply the power supply voltage VDD. The power switch circuit 17 is switched on receipt of the control signal (on request), and starts the supply of the power supply voltage VDD to the SSD controller 12 and the nonvolatile semiconductor memory 11. As a result, the SSD 10 is restored to the normal state.

The first embodiment is applied to the shift of the SSD 10 to the power saving state and the normal state as described below. For example, the user closes the display unit 202 for a moment and then immediately opens the display unit 202 during the use of the notebook personal computer 200 shown in FIG. 13. In this case, the above-mentioned device sleep is activated for a moment, and then the normal state is immediately restored.

Figure 16:
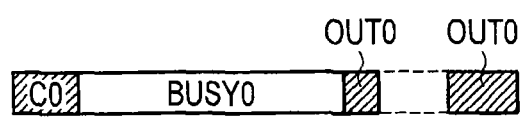
FIG. 16 is a time diagram showing an example of the activation of the device sleep in reading.

FIG. 16 is a time diagram showing an example of the activation of the device sleep in reading.

As shown in FIG. 16, in the period OUT0, when data held in the buffer in the nonvolatile semiconductor memory 11 is read by the data control unit of the SSD controller 12, the device sleep is activated, and then the reading of data is temporarily stopped. The state is then immediately restored to the normal state from the device sleep. As a result of the restore to the normal state, the reading of data in the buffer is resumed (latter period OUT0).

As described above, when the data in the buffer in the nonvolatile semiconductor memory 11 is read to the SSD controller 12, the state is shifted to the power saving state, for example, the device sleep, and then immediately restored to the normal state. In this case, if the reading of data from the buffer in the nonvolatile semiconductor memory 11 is temporarily interrupted and then resumed, the time required for reading can be shorter than when the reading of data is started again from the beginning. As a result, the nonvolatile semiconductor memory can be more efficiently used.

Figure 17:
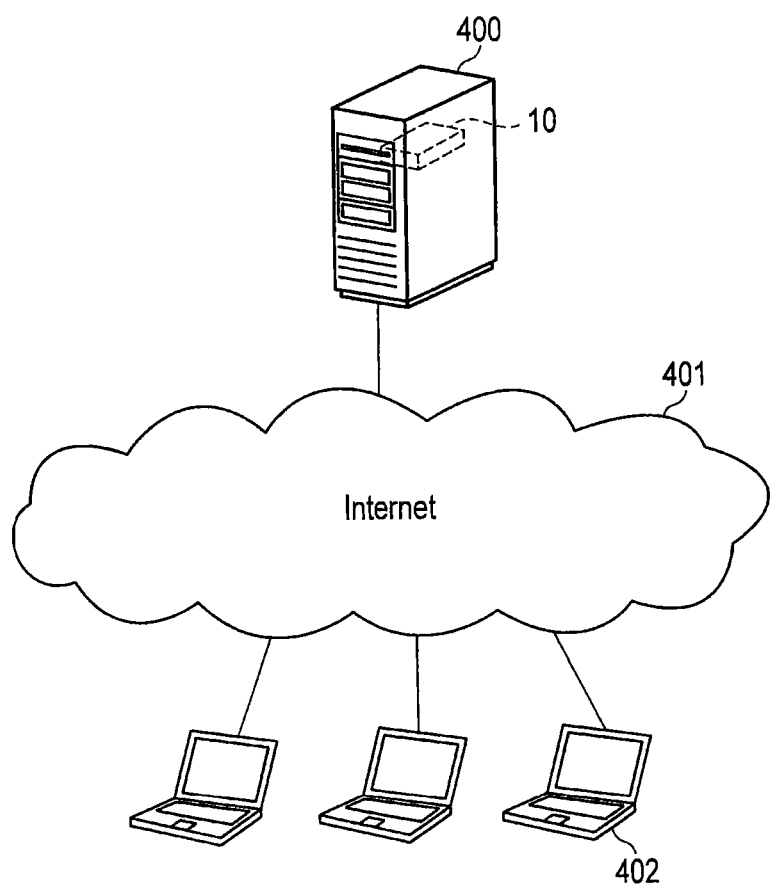
FIG. 17 is a conceptual diagram showing an example of the use of a server provided with the SSD according to the fourth embodiment.

FIG. 17 is a conceptual diagram showing an example of the use of a server provided with the SSD according to the fourth embodiment.

A server 400 is connected to the Internet 401. The server 400 is equipped with the SSD 10. A terminal such as a computer 402 is connected to the Internet 401. The user accesses the SSD 10 in the server 400 from the computer 402 via the Internet 401. The configuration and operation of the SSD 10 are similar to those according to the embodiments described above.

As described above, according to the above embodiments, operation performance in reading, writing, and erasing in the nonvolatile memory can be enhanced, and the SSD can be more efficiently used. It is also possible to provide a memory system capable of enhancing convenience for the user.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory configured to store data, the nonvolatile memory including a first memory and a second memory, the first memory including a first buffer and a first memory circuit, and the second memory including a second buffer and a second memory circuit;
   a command managing circuit configured to receive and manage a command;
   a command issuing circuit configured to issue the command received by the command managing circuit to the nonvolatile memory;

a data control circuit configured to control, based on the command, an operation that is one of reading of data from the nonvolatile memory and writing of data to the nonvolatile memory; and a command monitoring circuit configured to monitor the command managing circuit and output a receipt signal to the data control circuit when the command managing circuit receives the command, wherein the data control circuit interrupts transferring of data between the data control circuit and the nonvolatile memory based on a first command when receiving the receipt signal as to a second command from the command monitoring circuit, the command issuing circuit issues the second command to the nonvolatile memory after the interruption of the transferring of data between the data control circuit and the nonvolatile memory based on the first command, the data control circuit resumes the transferring of data between the data control circuit and the nonvolatile memory based on the first command after the issuance of the second command, and transferring of data between the first buffer and the data control circuit based on the first command is simultaneously performed with transferring of data between the second buffer and the second memory circuit based on the second command, after the resumption of the transferring of data between the data control circuit and the nonvolatile memory based on the first command.

2. The memory system according to claim 1, wherein the data control circuit interrupts the transferring of data between the data control circuit and the nonvolatile memory based on the first command while the transferring of data is being performed between the data control circuit and the nonvolatile memory, and the command issuing circuit issues the second command to the second memory.

3. The memory system according to claim 1, wherein the nonvolatile memory comprises first and second NAND type flash memories,
the first NAND type flash memory including the first memory, the second NAND type flash memory including the second memory.

4. The memory system according to claim 1, wherein the command managing circuit comprises a command queue circuit configured to store and manage the command, and a command reading circuit configured to read the command from the command queue circuit.

5. The memory system according to claim 1, wherein the nonvolatile memory comprises a plurality of NAND type flash memories.

6. The memory system according to claim 1, wherein the memory system comprises a solid state drive (SSD).

7. A memory system comprising:
a nonvolatile memory configured to store data, the nonvolatile memory including a first memory, the first memory including a first buffer and a first memory circuit; and
a controller configured to control the nonvolatile memory, the controller interrupting a first transferring of data between the controller and the first buffer, the first transferring being based on a first command, the controller issuing a second command to the nonvolatile memory, and then the controller resuming the first transferring of data between the controller and the first buffer, after the resumption of the first transferring, the first transferring of data between the controller and the first buffer being simultaneously performed with a second transferring of data between the first buffer and the first memory circuit, the second transferring being based on the second command.

8. The memory system according to claim 7, wherein the nonvolatile memory comprises a NAND type flash memory, the NAND type flash memory including the first memory.

9. The memory system according to claim 7, wherein the controller interrupts the first transferring of data between the controller and the first buffer while the first transferring is being performed, and the controller issues the second command to the first memory.

10. The memory system according to claim 7, wherein the controller comprises a command queue circuit configured to store and manage the first and second commands, and a command reading circuit configured to read the first and second commands from the command queue circuit.

11. The memory system according to claim 7, wherein the memory system comprises a solid state drive (SSD).

12. A memory system comprising:
a nonvolatile memory configured to store data, the nonvolatile memory including a first memory and a second memory, the first memory including a first buffer and a first memory circuit, the second memory including a second buffer and a second memory circuit; and
a controller configured to control the nonvolatile memory, the controller interrupting a first transferring of data between the controller and the first buffer, the first transferring being based on a first command, the controller issuing a second command to the nonvolatile memory, and then the controller resuming the first transferring of data between the controller and the first buffer, after the resumption of the first transferring, the first transferring of data between the controller and the first buffer being simultaneously performed with a second transferring of data between the second buffer and the second memory circuit, the second transferring being based on the second command.

13. The memory system according to claim 12, wherein the controller interrupts the first transferring of data between the controller and the first buffer while the first transferring is being performed, and the controller issues the second command to the second memory.

14. The memory system according to claim 12, wherein the controller comprises a command queue circuit configured to store and manage the first and second commands, and a command reading circuit configured to read the first and second commands from the command queue circuit.

15. A memory system comprising:
a nonvolatile memory configured to store data, the nonvolatile memory including a first memory, the first memory including a first buffer and a first memory circuit; and
a controller configured to control the nonvolatile memory, during a first transferring of data being in progress between the first buffer and the first memory circuit, the first transferring being based on a first command, the controller issuing a second command to the nonvolatile memory, after the issue of the second command, a second transferring of data between the controller and the first buffer being simultaneously performed with a third transferring of data between the first buffer and the first memory circuit, the second transferring being based on the first command and the third transferring being based on the second command.

16. The memory system according to claim 15, wherein the nonvolatile memory comprises a NAND type flash memory, the NAND type flash memory including the first memory.

17. The memory system according to claim 15, wherein the controller comprises a command queue circuit configured to store and manage the first and second commands, and a command reading circuit configured to read the first and second commands from the command queue circuit.

18. The memory system according to claim 15, wherein the memory system comprises a solid state drive (SSD).

19. A memory system comprising:
a nonvolatile memory con figured to store data, the nonvolatile memory including a first memory and a second memory, the first memory including a first buffer and a first memory circuit, the second memory including a second buffer and a second memory circuit; and a controller configured to control the nonvolatile memory, during a first transferring of data being in progress between the first buffer and the first memory circuit, the first transferring being based on a first command, the controller issuing a second command to the nonvolatile memory, after the issue of the second command, a second transferring of data between the controller and the first buffer being simultaneously performed with a third transferring of data between the second buffer and the second memory circuit, the second transferring being based on the first command and the third transferring is based on the second command.

20. The memory system according to claim 19, wherein the controller comprises a command queue circuit configured to store and manage the first and second commands, and a command reading circuit configured to read the first and second commands from the command queue circuit.

* * * * *